(12) United States Patent
Nobori et al.

(10) Patent No.: US 12,150,219 B2
(45) Date of Patent: Nov. 19, 2024

(54) CERAMIC HEATER AND MANUFACTURING METHOD FOR THE SAME

(71) Applicant: NGK INSULATORS, LTD., Nagoya (JP)

(72) Inventors: Kazuhiro Nobori, Nagoya (JP); Takuji Kimura, Nagoya (JP); Tomohisa Mizoguchi, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 963 days.

(21) Appl. No.: 17/132,381

(22) Filed: Dec. 23, 2020

(65) Prior Publication Data

US 2021/0120633 A1  Apr. 22, 2021

Related U.S. Application Data

(63) Continuation of application No. PCT/JP2020/004093, filed on Feb. 4, 2020.

(30) Foreign Application Priority Data

Feb. 19, 2019 (JP) .................................. 2019-027685

(51) Int. Cl.
*H05B 3/28* (2006.01)

(52) U.S. Cl.
CPC ....... *H05B 3/283* (2013.01); *H05B 2203/002* (2013.01); *H05B 2203/016* (2013.01); *H05B 2203/017* (2013.01)

(58) Field of Classification Search
None
See application file for complete search history.

(56) References Cited

U.S. PATENT DOCUMENTS

| | | | | |
|---|---|---|---|---|
| 4,871,902 A | * | 10/1989 | Kicherer | ................. H05B 3/70 219/468.2 |
| 2003/0075537 A1 | * | 4/2003 | Okajima | ................. H05B 3/68 219/468.1 |

(Continued)

FOREIGN PATENT DOCUMENTS

| | | |
|---|---|---|
| JP | 2002-057107 A1 | 2/2002 |
| JP | 2003-133195 A1 | 5/2003 |

(Continued)

OTHER PUBLICATIONS

Translation of KR-20160008817-A (Year: 2016).*

(Continued)

*Primary Examiner* — Elizabeth M Kerr
(74) *Attorney, Agent, or Firm* — BURR PATENT LAW, PLLC (57) ABSTRACT

A ceramic heater includes a ceramic plate. An outer-peripheral-side resistance heating element is disposed in an outer peripheral zone of the ceramic plate. A wire line extends from each of a pair of terminals disposed in a central portion of the ceramic plate toward the outer peripheral zone, and a portion of the wire line close to the outer peripheral zone is a linear portion. A connection terminal is a conductive member connecting between the wire line and the outer-peripheral-side resistance heating element, and includes a first hole into which the linear portion of the wire line is inserted and a second hole into which an end portion of the outer-peripheral-side resistance heating element is inserted.

14 Claims, 8 Drawing Sheets

(56) References Cited

U.S. PATENT DOCUMENTS

| | | | |
|---|---|---|---|
| 2003/0173349 A1* | 9/2003 | Unno | H01L 21/67103 |
| | | | 219/541 |
| 2003/0183616 A1* | 10/2003 | Goto | H05B 3/748 |
| | | | 219/468.1 |
| 2014/0326708 A1* | 11/2014 | Barfuss | B60N 2/5685 |
| | | | 219/202 |
| 2016/0262210 A1* | 9/2016 | Xie | H05B 3/145 |
| 2017/0280509 A1 | 9/2017 | Takebayashi | |
| 2019/0027854 A1* | 1/2019 | Yoshioka | H01R 13/20 |
| 2019/0123457 A1* | 4/2019 | Bulgajewski | H05K 1/0209 |

FOREIGN PATENT DOCUMENTS

| | | | |
|---|---|---|---|
| JP | 2003-272805 A1 | | 9/2003 |
| JP | 3897563 B2 | | 3/2007 |
| KR | 20160008817 A | * | 1/2016 |
| TW | 201714246 A | | 4/2017 |

OTHER PUBLICATIONS

English translation of the International Preliminary Report on Patentability (Chapter I) dated Sep. 2, 2021 (Application No. PCT/JP2020/004093).

International Search Report and Written Opinion (Application No. PCT/JP2020/004093) dated Apr. 14, 2020.

Taiwanese Office Action (Application No. 109103654) dated Oct. 30, 2020.

* cited by examiner

CERAMIC HEATER AND MANUFACTURING METHOD FOR THE SAME

BACKGROUND OF THE INVENTION

1. Field of the Invention

The present invention relates to a ceramic heater and a manufacturing method for the ceramic heater.

2. Description of the Related Art

A ceramic heater for heating a wafer is used in a semiconductor manufacturing apparatus. The so-called 2-zone heater is known as such a ceramic heater. In one known example of the 2-zone heater, as disclosed in Patent Literature (PTL) 1, an inner-peripheral-side resistance heating element and an outer-peripheral-side resistance heating element are embedded in a ceramic base to position in the same plane, and heats generated from the resistance heating elements are independently controlled by applying voltages to the resistance heating elements independently. PTL 1 discloses, by way of example, a molybdenum coil as the outer-peripheral-side resistance heating element. PTL 1 further discloses, by way of example, a molybdenum wire used as a conductive connecting portion that extends from each of a pair of terminals disposed in a central portion of the ceramic base up to an end of the outer-peripheral-side resistance heating element.

CITATION LIST

Patent Literature

PTL 1: Japanese Patent No. 3897563 (FIGS. 1 to 3, paragraph 0056)

SUMMARY OF THE INVENTION

As a practical example, the above-mentioned type of ceramic heater can be manufactured by drying a ceramic molded body that has been formed by a mold casting process, degreasing and calcining the ceramic molded body, and then performing hot-press firing on it. However, there is a possibility that, in a step of drying the ceramic molded body that has been formed by the mold casting process, the conductive connecting portion made of the molybdenum wire cannot follow dry shrinkage of the molded body and the molded body is broken after the drying due to stress applied to the molded body.

The present invention has been made with intent to solve the above-mentioned problem, and a main object of the present invention is to suppress breakage of a ceramic plate in which an outer-peripheral-side resistance heating element is connected to wire lines extending from a center of the ceramic plate toward an outer periphery.

A ceramic heater of the present invention includes:
  a disk-shaped ceramic plate having a wafer placement surface and an annular outer peripheral zone;
  an outer-peripheral-side resistance heating element disposed in the outer peripheral zone;
  a wire line extending from each of a pair of terminals disposed in a central portion of the ceramic plate toward the outer peripheral zone, a portion of the wire line close to the outer peripheral zone being a linear portion; and
  a conductive connection terminal including a first hole into which the linear portion of the wire line is inserted, and a second hole into which an end portion of the outer-peripheral-side resistance heating element is inserted, the connection terminal connecting between the wire line and the outer-peripheral-side resistance heating element.

In the above-described ceramic heater, the linear portion of the wire line extending from each of the pair of terminals disposed in the central portion of the ceramic plate toward the outer peripheral zone and the end portion of the outer-peripheral-side resistance heating element disposed in the outer peripheral zone are connected by the conductive connection terminal. The connection terminal includes the first hole into which the linear portion of the wire line is inserted, and the second hole into which the end portion of the outer-peripheral-side resistance heating element is inserted. Therefore, even if the wire line cannot follow dry shrinkage of the ceramic molded body when the ceramic plate is fabricated by the mold casting process, great stress is not applied to the ceramic molded body because the linear portion of the wire line is movable in the first hole of the connection terminal. Hence breakage of the ceramic plate is suppressed.

In the ceramic heater according to the present invention, the first hole and the second hole may be disposed parallel to each other. With this feature, during the dry shrinkage of the ceramic molded body, the linear portion of the wire line is movable in the first hole and the end portion of the outer-peripheral-side resistance heating element is also movable in the second hole. Hence the stress applied to the ceramic molded body can be further reduced.

In the ceramic heater according to the present invention, the outer-peripheral-side resistance heating element and the wire line may be disposed in different planes, and the connection terminal may be present in the plane in which the wire line is disposed. With this feature, the wire line can be placed with no need of paying attention to a pattern of the outer-peripheral-side resistance heating element.

In the ceramic heater according to the present invention, the linear portion of the wire line may penetrate through the first hole. With this feature, the wire line can be prevented from falling out of the first hole of the connection terminal.

In the ceramic heater according to the present invention, the connection terminal may have a shape including no edges on an outer surface thereof. With this feature, the occurrence of a crack in the ceramic plate starting from the outer surface of the connection terminal can be suppressed.

In the ceramic heater according to the present invention, the connection terminal may have a shape vertically crushed from above and below the ceramic plate. With this feature, an inner surface of the crushed first hole of the connection terminal is reliably connected to the wire line, and an inner surface of the crushed second hole of the connection terminal is reliably connected to the outer-peripheral-side resistance heating element.

In the ceramic heater according to the present invention, the outer-peripheral-side resistance heating element may be in the form of a coil. With this feature, an amount of heat generated from the outer-peripheral-side resistance heating element can be relatively increased. However, the end portion of the outer-peripheral-side resistance heating element, inserted into the second hole, is preferably linear.

The ceramic heater according to the present invention may include an inner-peripheral-side resistance heating element in a circular inner peripheral zone of the ceramic plate, and voltages may be independently applied to the innerperipheral-side resistance heating element and the outer-peripheral-side resistance heating element. With this feature, heats generated from individual resistance heating elements can be independently controlled.

A manufacturing method for a ceramic heater of the present invention includes steps of:
(a) forming a disk-shaped first ceramic molded body by a mold casting process;
(b) placing an outer-peripheral-side resistance heating element in an outer peripheral zone located in a predetermined surface of the first ceramic molded body, placing a wire line extending from each of a pair of terminals disposed in a central portion of the first ceramic molded body toward the outer peripheral zone, a portion of the wire line close to the outer peripheral zone being a linear portion, inserting the linear portion of the wire line into a first hole of a conductive connection terminal with a play relative to a hole inner surface, the conductive connection terminal including the first hole and a second hole, and inserting an end portion of the outer-peripheral-side resistance heating element into the second hole,
(c) forming a disk-shaped second ceramic molded body on the predetermined surface of the first ceramic molded body by the mold casting process;
(d) drying a ceramic molded body including the first and second ceramic molded bodies to obtain a dried body; and
(e) performing hot-press firing on the dried body.

With the above-described manufacturing method for the ceramic heater, the ceramic molded body including the first and second ceramic molded bodies, which is formed in the step (c) by the mold casting process, includes the outer-peripheral-side resistance heating element, the wire line, and the connection terminal. The linear portion of the wire line is inserted into the first hole of the connection terminal, and the end portion of the outer-peripheral-side resistance heating element is inserted into the second hole of the connection terminal. Therefore, even if the wire line cannot follow dry shrinkage of the ceramic molded body when the ceramic molded body is dried in the step (d), great stress is not applied to the ceramic molded body because the linear portion of the wire line is movable in the first hole of the connection terminal. Hence breakage of the ceramic plate is suppressed. This manufacturing method is suitable for manufacturing the above-described ceramic heater.

In the manufacturing method for the ceramic heater according to the present invention, in the above-described step (b), the linear portion of the wire line may penetrate through the first hole. With this feature, the wire line can be prevented from falling out of the first hole of the connection terminal.

In the manufacturing method for the ceramic heater according to the present invention, the connection terminal may have a shape including no edges on an outer surface thereof. With this feature, the occurrence of a crack in the ceramic plate starting from the outer surface of the connection terminal can be suppressed.

In the manufacturing method for the ceramic heater according to the present invention, in the above-described step (e), the connection terminal may be vertically crushed from above and below the ceramic plate. With this feature, an inner surface of the crushed first hole of the connection terminal is reliably connected to the wire line, and an inner surface of the crushed second hole of the connection terminal is reliably connected to the outer-peripheral-side resistance heating element.

In the manufacturing method for the ceramic heater according to the present invention, the outer-peripheral-side resistance heating element may be in the form of a coil. With this feature, an amount of heat generated from the outer-peripheral-side resistance heating element can be relatively increased. However, the end portion of the outer-peripheral-side resistance heating element, inserted into the second hole, is preferably linear.

The term "mold casting process" refers to a process of obtaining a molded body by injecting, into a shaping mold, ceramic slurry that contains ceramic material powder and a molding agent, causing the molding agent to develop a chemical reaction in the shaping mold, and solidifying the ceramic slurry into a molded body. The molding agent may contain, for example, isocyanate and polyol such that the ceramic slurry is solidified into the molded body by a urethane reaction.

DETAILED DESCRIPTION OF THE INVENTION

Figure 1:
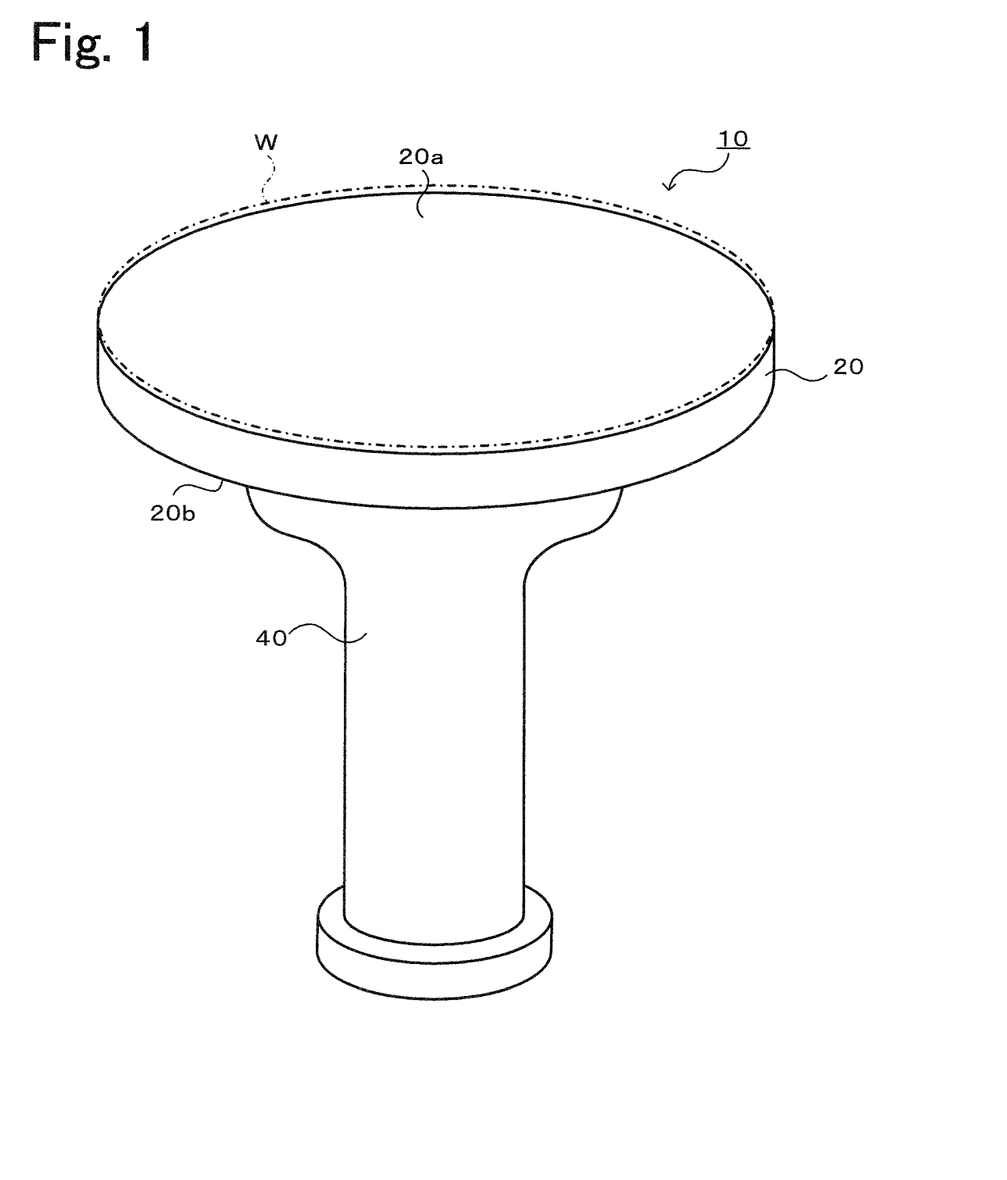
FIG. 1 is a perspective view of a ceramic heater 10.
Figure 2:
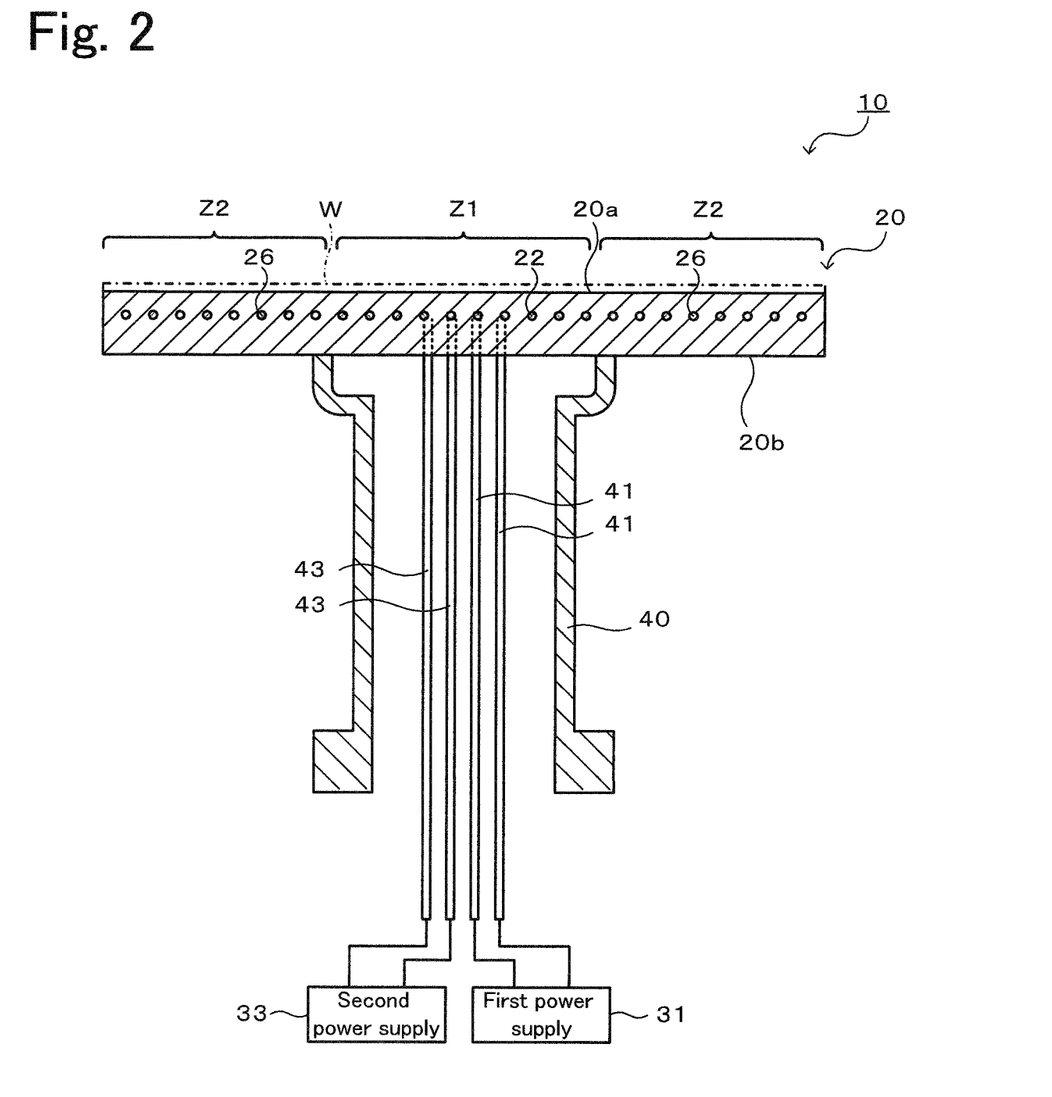
FIG. 2 is a vertical sectional view of the ceramic heater 10.
Figure 3:
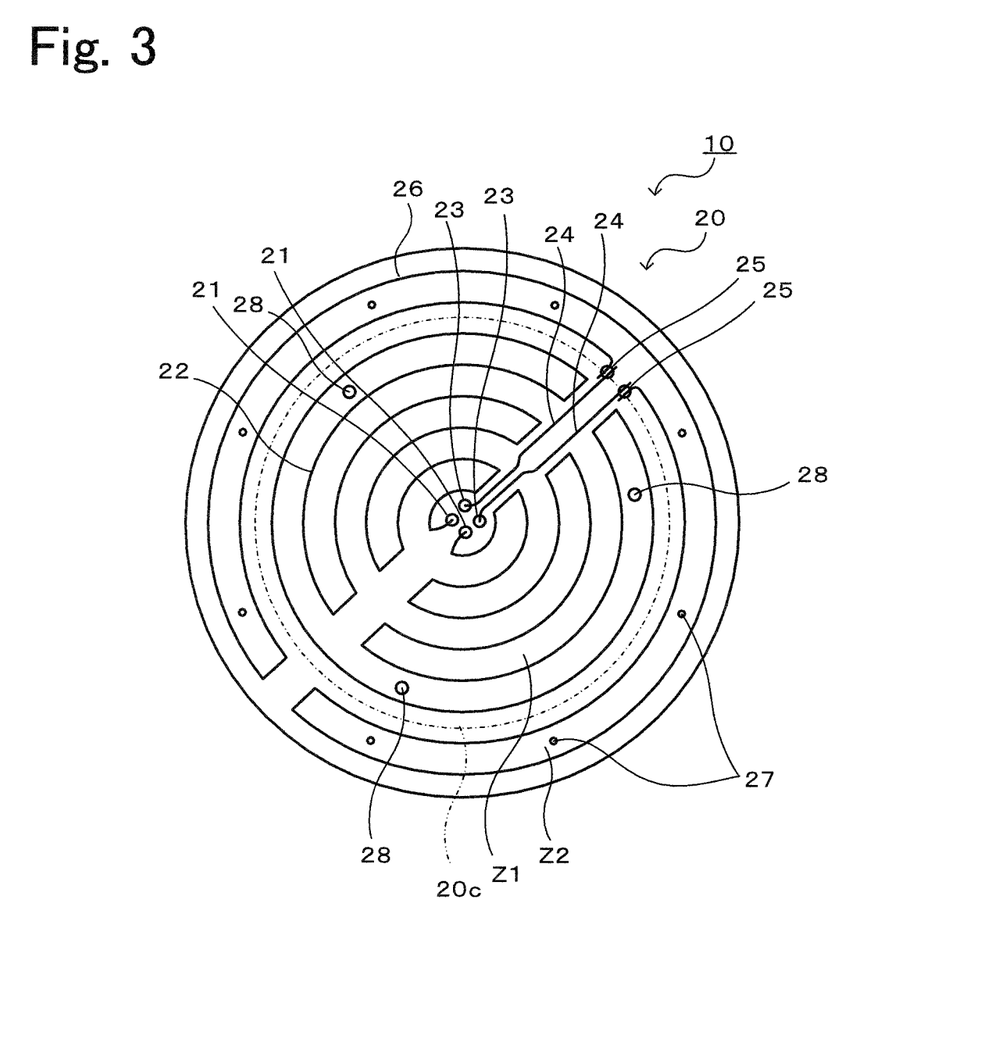
FIG. 3 is a sectional view of a ceramic plate 20 when the ceramic plate is horizontally sectioned along inner- and outer-peripheral-side resistance heating elements 22 and 26 and is viewed from above.
Figure 4:
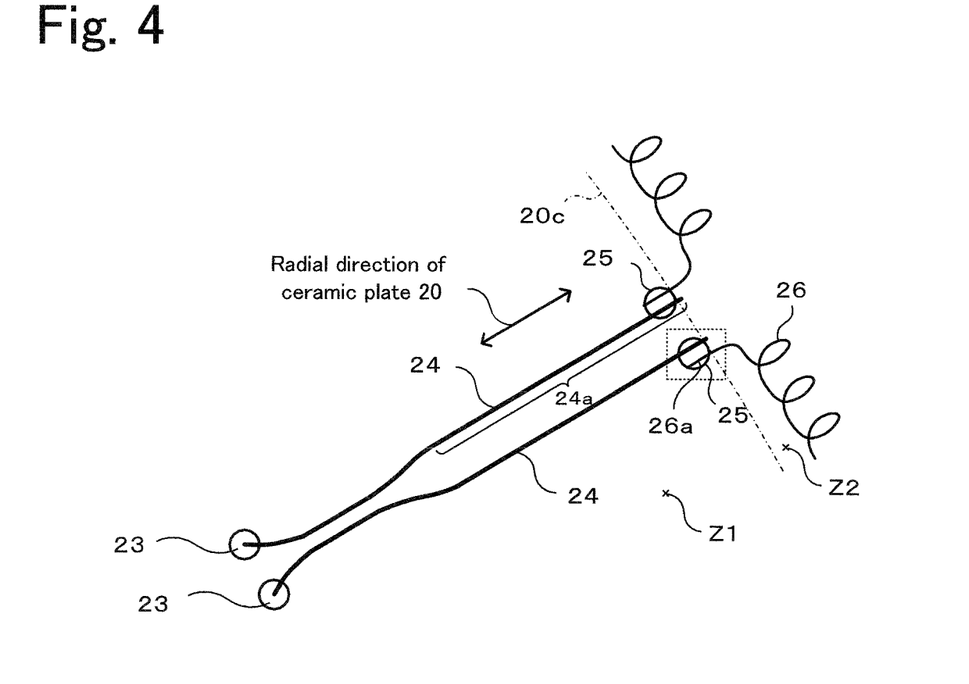
FIG. 4 is an enlarged view of a region including wire lines 24 and its surroundings in FIG. 3.
Figure 5:
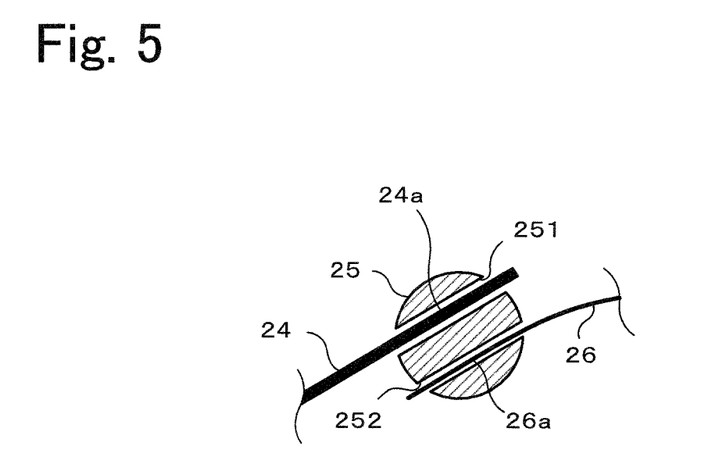
FIG. 5 is an enlarged view of a region within a dotted frame in FIG. 4.

A preferred embodiment of the present invention will be described below with reference to the drawings. FIG. 1 is a perspective view of a ceramic heater 10, FIG. 2 is a vertical sectional view of the ceramic heater 10 (namely, a sectional view of the ceramic heater 10 when the ceramic heater is sectioned along a plane including a center axis), and FIG. 3 is a sectional view of a ceramic plate 20 when the ceramic plate is horizontally sectioned along inner- and outer-peripheral-side resistance heating elements 22 and 26 and is viewed from above. FIG. 3 substantially represents a planar structure of the ceramic plate 20 when viewed from a wafer placement surface 20a. Note that, in FIG. 3, hatching denoting a sectioned surface is omitted. FIG. 4 is an enlarged view of a region including wire lines 24 and its surroundings in FIG. 3, and FIG. 5 is an enlarged view of a region within a dotted frame in FIG. 4.

The ceramic heater 10 is used to heat a wafer W on which processing, such as etching or CVD, is to be performed, and is installed within a not-illustrated vacuum chamber. The ceramic heater 10 includes the ceramic plate 20 that is in the form of a disk and has the wafer placement surface 20a, and a tubular shaft 40 that is joined, coaxially with the ceramic plate 20, to a surface (rear surface) 20b of the ceramic plate 20 on the opposite side to the wafer placement surface 20a.

The ceramic plate 20 is a disk-shaped plate made of a ceramic material represented by aluminum nitride, alumina, or the like. The diameter of the ceramic plate 20 is, for example, about 300 mm. Although not illustrated, fine irregularities are formed on the wafer placement surface 20a of the ceramic plate 20 by an embossing process. The ceramic plate 20 is divided by an imaginary boundary 20c (see FIG. 3), which is concentric to the ceramic plate 20, into an inner peripheral zone Z1 having a small circular shape and an outer peripheral zone Z2 having an annular shape. The diameter of the imaginary boundary 20c is, for example, about 200 mm. The inner-peripheral-side resistance heating element 22 is embedded in the inner peripheral zone Z1 of the ceramic plate 20, and the outer-peripheral-side resistance heating element 26 is embedded in the outer peripheral zone Z2. Both the resistance heating elements 22 and 26 are disposed on the same plane parallel to the wafer placement surface 20a.

As illustrated in FIG. 3, the ceramic plate 20 includes a plurality of gas holes 27. The gas holes 27 penetrate through the ceramic plate 20 from the rear surface 20b to the wafer placement surface 20a and supply gas to gaps defined between the irregularities formed on the wafer placement surface 20a and the wafer W placed on the wafer placement surface 20a. The gas supplied to the gaps serves to increase thermal conductivity between the wafer placement surface 20a and the wafer W. The ceramic plate 20 further includes a plurality of lift pin holes 28. The lift pin holes 28 penetrate through the ceramic plate 20 from the rear surface 20b to the wafer placement surface 20a, and not-illustrated lift pins are inserted into the lift pin holes 28. The lift pins are used to lift the wafer W placed on the wafer placement surface 20a. In this embodiment, three lift pin holes 28 are formed on the same circumference at equal angular intervals.

As illustrated in FIG. 3, the inner-peripheral-side resistance heating element 22 is formed such that it starts from one of a pair of terminals 21 and 21 disposed in a central portion of the ceramic plate 20 (namely, a region on the rear surface 20b of the ceramic plate 20, the region being surrounded by the tubular shaft 40), and that it reaches the other of the pair of terminals 21 and 21 after being wired in a one-stroke pattern substantially over the entirety of the inner peripheral zone Z1 while being folded at a plurality of turn-around points. The inner-peripheral-side resistance heating element 22 is in the form of a coil. The diameter of a heater element wire constituting the inner-peripheral-side resistance heating element 22 is preferably 0.4 to 0.6 mm, and the winding diameter of the coil is preferably 2.0 to 6.0 mm. The material of the inner-peripheral-side resistance heating element 22 may be, for example, a refractory metal or its carbide. The refractory metal may be, for example, tungsten, molybdenum, tantalum, platinum, rhenium, hafnium, or any of alloys of those elements. The carbide of the refractory metal may be, for example, tungsten carbide or molybdenum carbide.

As illustrated in FIG. 3, the outer-peripheral-side resistance heating element 26 is formed such that it starts from one of a pair of connection terminals 25 and 25 embedded in the ceramic plate 20, and then reaches the other of the pair of connection terminals 25 and 25 after being wired in a one-stroke pattern substantially over the entirety of the outer peripheral zone Z2 while being folded at a plurality of turn-around points. The outer-peripheral-side resistance heating element 26 is in the form of a coil obtained by spirally winding a heater element wire except for both end portions 26a, and both the end portions 26a linearly extend in the radial direction of the ceramic plate 20. The diameter of the heater element wire constituting the outer-peripheral-side resistance heating element 26 is preferably 0.4 to 0.6 mm, and the winding diameter of the coil is preferably 2.0 to 6.0 mm. The material of the outer-peripheral-side resistance heating element 26 may be, for example, a refractory metal or its carbide. Specific examples of those materials are as per described above. A pair of terminals 23 and 23 of the outer-peripheral-side resistance heating element 26 is formed in the central portion of the ceramic plate 20. Wire lines 24 are each disposed between the terminal 23 and the connection terminal 25.

As illustrated in FIG. 4, one end of each wire line 24 is connected to the terminal 23 and extends from the terminal 23 toward the outer peripheral zone Z2, while the other end of the wire line 24 is connected to the connection terminal 25. The wire line 24 is disposed on the same plane as the outer-peripheral-side resistance heating element 26. A portion of the wire line 24 close to the outer peripheral zone Z2 is formed as a linear portion 24a. The linear portion 24a extends along the radial direction of the ceramic plate 20. The diameter of the wire line 24 is preferably 0.4 to 1.0 mm. The material of the wire line 24 may be, for example, a refractory metal or its carbide. Specific examples of those materials are as per described above.

The connection terminal 25 is a conductive member connecting between the wire line 24 and the outer-peripheral-side resistance heating element 26. The connection terminal 25 has a shape resulting from crushing a ball from above and below, and includes a first hole 251 and a second hole 252 formed such that, as illustrated in FIG. 5, passages defining the holes when viewed in section are parallel to each other and extend along the radial direction of the ceramic plate 20. The linear portion 24a of the wire line 24 is inserted into the first hole 251, and the linear end portion 26a of the outer-peripheral-side resistance heating element 26 is inserted into the second hole 252. The linear portion 24a of the wire line 24 is brought into contact with an inner surface of the first hole 251 by crushing the first hole 251 in the vertical direction. The end portion 26a of the outer-peripheral-side resistance heating element 26 is brought into contact with an inner surface of the second hole 252 by crushing the second hole 252 in the vertical direction. The material of the connection terminal 25 may be, for example, a refractory metal or its carbide. Specific examples of those materials are as per described above.

The tubular shaft 40 is made of ceramic, such as aluminum nitride or alumina, like the ceramic plate 20. The inner diameter of the tubular shaft 40 is, for example, about 40 mm, and the outer diameter is, for example, about 60 mm. An upper end of the tubular shaft 40 is joined to the ceramic plate 20 by diffusion bonding. Power feeder rods 41 and 41 connected to respectively the pair of terminals 21 and 21 of the inner-peripheral-side resistance heating element 22 and power feeder rods 43 and 43 connected to respectively the pair of terminals 23 and 23 of the outer-peripheral-side resistance heating element 26 are disposed inside the tubular shaft 40. The power feeder rods 41 and 41 are connected to a first power supply 31, and the power feeder rods 43 and 43 are connected to a second power supply 33. Therefore, the temperature in the inner peripheral zone Z1 heated by the inner-peripheral-side resistance heating element 22 and the temperature in the outer peripheral zone Z2 heated by the outer-peripheral-side resistance heating element 26 can be controlled separately. Although not illustrated, gas supply pipes through which the gas is supplied to the gas holes 27 and the lift pins inserted into the lift pin holes 28 are also disposed inside the tubular shaft 40.

An example of use of the ceramic heater 10 will be described below. First, the ceramic heater 10 is installed within the not-illustrated vacuum chamber, and the wafer W is placed on the wafer placement surface 20a of the ceramic heater 10. Then, electric power supplied to the inner-peripheral-side resistance heating element 22 is adjusted by the first power supply 31 such that the temperature in the inner peripheral zone Z1 detected by a not-illustrated inner-peripheral-side thermocouple is kept at a predetermined inner-peripheral-side target temperature. Furthermore, electric power supplied to the outer-peripheral-side resistance heating element 26 is adjusted by the second power supply 33 such that the temperature in the outer peripheral zone Z2 detected by a not-illustrated outer-peripheral-side thermocouple is kept at a predetermined outer-peripheral-side target temperature. Thus the temperature of the wafer W is controlled to be kept at a desired temperature. Thereafter, the interior of the vacuum chamber is evacuated to a state under a vacuum atmosphere or a pressure reduced atmosphere, plasma is generated inside the vacuum chamber, and CVD film formation or etching is performed on the wafer W by utilizing the generated plasma.

An example of manufacturing of the ceramic heater 10 will be described below. FIGS. 6A to 6E illustrates a manufacturing process for the ceramic plate 20.

1. First Molding Step (See FIG. 6A)

Figure 6A:
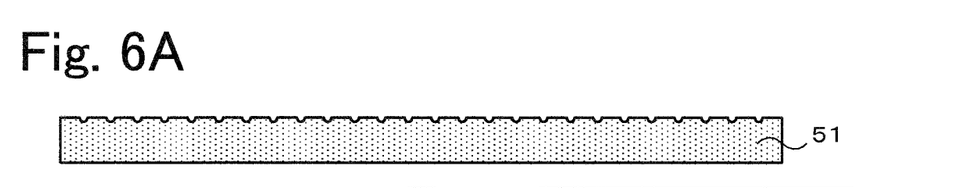
FIGS. 6A to 6E illustrate a manufacturing process for the ceramic plate 20.

For a start, a first ceramic molded body 51 used to manufacture the ceramic heater 10 is formed by a mold casting process. The first ceramic molded body 51 is a portion that finally becomes a lower layer of the ceramic plate 20. The first ceramic molded body 51 has, in its upper surface, recesses in which the inner-peripheral-side resistance heating element 22, the outer-peripheral-side resistance heating element 26, the wire lines 24 and 24, and the connection terminals 25 and 25 are to be placed. An inner space of a shaping mold (not illustrated) used to mold the first ceramic molded body 51 has the same shape as the first ceramic molded body 51. The first ceramic molded body 51 is obtained by injecting ceramic slurry into the shaping mold, and by solidifying the injected slurry. Detailed procedures are as follows.

A ceramic slurry precursor is prepared by adding a solvent and a dispersant to ceramic powder, and by mixing them. The particle size of the ceramic powder is not limited to a particular value insofar as the slurry can be prepared and adjusted. The solvent is not limited to particular one insofar as the solvent can dissolve the dispersant, isocyanate, polyol, and a catalyst. Examples of the solvent include a hydrocarbon solvent (such as toluene, xylene, or solvent naphtha), an ether solvent (such as ethylene glycol monoethyl ether, butyl carbitol, or butyl carbitol acetate), an alcohol solvent (such as isopropanol, 1-butanol, ethanol, 2-ethylhexanol, terpineol, ethylene glycol, or glycerin), a ketone solvent (such as acetone or methyl ethyl ketone), an ester (such as butyl acetate, dimethyl glutarate, or triacetin), and a polybasic acid solvent (such as glutaric acid). In particular, it is preferable to use the solvent having two or more ester bonds, such as a polybasic acid ester (for example, dimethyl glutarate) or a polyalcohol acid ester (for example, triacetin). The dispersant is not limited to particular one insofar as the dispersant enables, for example, the ceramic powder to be homogeneously dispersed in the solvent. Examples of the dispersant include a polycarboxylic copolymer, a polycarboxylate, a sorbitan fatty acid ester, a polyglycerin fatty acid ester, a phosphate ester salt copolymer, a sulfonate copolymer, and a polyurethane polyester copolymer containing tertiary amine. In particular, it is preferable to use, for example, the polycarboxylic copolymer and the polycarboxylate. By adding the above-mentioned dispersant, the slurry before the molding can be prepared with low viscosity and high fluidity. As described above, the ceramic slurry precursor is prepared by adding the solvent and the dispersant to the ceramic powder at a predetermined ratio, and by mixing and disintegrating them for a predetermined time.

Then, ceramic slurry is prepared by adding a molding agent (isocyanate and polyol) and a catalyst to the ceramic slurry precursor, and by mixing and vacuum-debubbling them. The isocyanate is not limited to particular one insofar as it contains an isocyanate group as a functional group. Examples of the isocyanate usable here are hexamethylene diisocyanate (HDI), tolylene diisocyanate (TDI), diphenylmethane diisocyanate (MDI), and substances modified from the formers. Molecules of the isocyanate may contain a reactive functional group other than the isocyanate group, or may contain a large number of reactive functional groups like polyisocyanate. The polyol is not limited to particular one insofar as it contains a functional group, such as a hydroxyl group or an amino group, capable of reacting with the isocyanate group. Examples of the polyol usable here are ethylene glycol (EG), polyethylene glycol (PEG), propylene glycol (PG), polypropylene glycol (PPG), polytetramethylene glycol (PTMG), polyhexamethylene glycol (PHMG), and polyvinyl butyral (PVB). The catalyst is not limited to particular one insofar as it promotes a urethane reaction. Examples of the catalyst usable here are triethylenediamine, hexanediamine, 6-dimethylamino-1-hexanol, 1,5-diazacyclo(4.3.0)nonene-5,1,8-diazabicyclo[5.4.0]-7-undecene, dimethylbenzylamine, and hexamethyltetraethylenetetramine. After filling the ceramic slurry into an inner space of the shaping mold, the ceramic slurry is solidified by producing, as an organic binder, urethane resin with a chemical reaction (urethane reaction) caused by the isocyanate and the polyol, and by bridging between adjacent molecules of the urethane resin such that urethane groups (—O—CO—NH—) produced in those molecules are bonded to each other. The urethane resin functions as an organic binder. Thus the first ceramic molded body 51 is obtained by the mold casting process.

A mixing method performed in preparing the ceramic slurry precursor and the ceramic slurry is not limited to particular one. For example, a ball mill, planetary centrifugal mixing, vibratory mixing, propeller stirring, or a static mixer can be used. The size of the first ceramic molded body 51 is determined in consideration of the size of the ceramic heater 10, dry shrinkage, firing shrinkage, and so on.

2. Placement Step (See FIG. 6B)

Figure 6B:
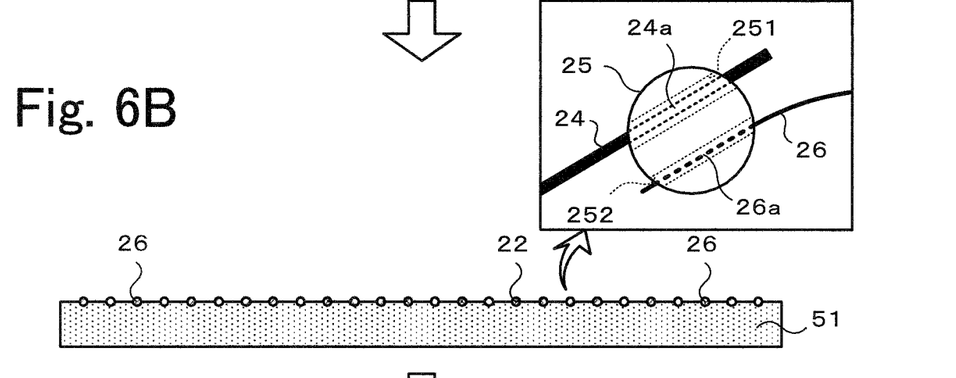

Then, the inner-peripheral-side resistance heating element 22, the outer-peripheral-side resistance heating element 26, the wire lines 24 and 24, and the connection terminals 25 and 25 are placed in the recesses formed in the upper surface of the first ceramic molded body 51. More specifically, the inner-peripheral-side resistance heating element 22 is placed in an inner peripheral zone of the first ceramic molded body 51, and the outer-peripheral-side resistance heating element 26 is placed in an outer peripheral zone of the first ceramic molded body 51. A frame in FIG. 6B represents an inner structure of the connection terminal 25 when viewing it from above. As illustrated in FIG. 6B, the linear end portion 26a of the outer-peripheral-side resistance heating element 26 is inserted into the second hole 252 of the connection terminal 25 having a ball-like shape. The end portion 26a may be inserted into the second hole 252 with a play relative to a hole inner surface, or without the play. One end of the wire line 24 is placed at a position of the terminal 23, and the linear portion 24a is inserted into the first hole 251 of the connection terminal 25 with a play relative to a hole inner surface. Thus the linear portion 24a of the wire line 24 is movably inserted into the first hole 251. At that time, the linear portion 24a of the wire line 24 is arranged to penetrate through the first hole 251. Accordingly, the wire line 24 can be prevented from falling out of the first hole 251. For the same reason, the end portion 26a of the outer-peripheral-side resistance heating element 26 is also preferably arranged to penetrate through the second hole 252. The diameter of the ball-like connection terminal 25 is, for example, about 3 to 4 mm.

3. Second Molding Step (See FIG. 6C)

Figure 6C:
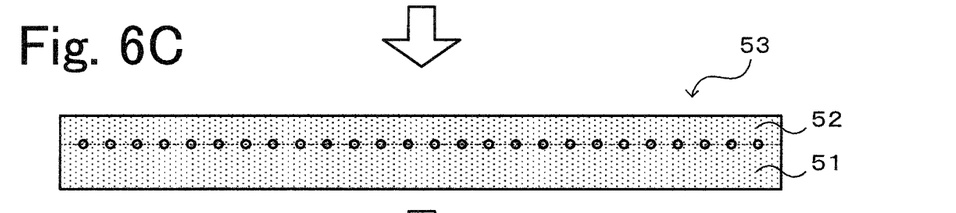

Then, a second ceramic molded body 52 is formed on the upper surface of the first ceramic molded body 51 by a mold casting process. The second ceramic molded body 52 is a portion that finally becomes an upper layer of the ceramic plate 20. A shaping mold (not illustrated) used to mold the second ceramic molded body 52 defines a space having the same shape as the second ceramic molded body 52 over the upper surface of the first ceramic molded body 51. The second ceramic molded body 52 is formed by injecting ceramic slurry into the space, and by solidifying the injected slurry. Detailed procedures are similar to those in the first molding step. With the second molding step, a ceramic molded body 53 in the integrated form of the first and second ceramic molded bodies 51 and 52 is obtained. The ceramic molded body 53 has such a structure that the inner-peripheral-side resistance heating element 22, the outer-peripheral-side resistance heating element 26, the wire lines 24 and 24, and the connection terminals 25 and 25 are sandwiched between the first and second ceramic molded bodies 51 and 52.

4. Drying, Degreasing, and Calcining Steps (See FIG. 6D)

(1) Drying

Figure 6D:
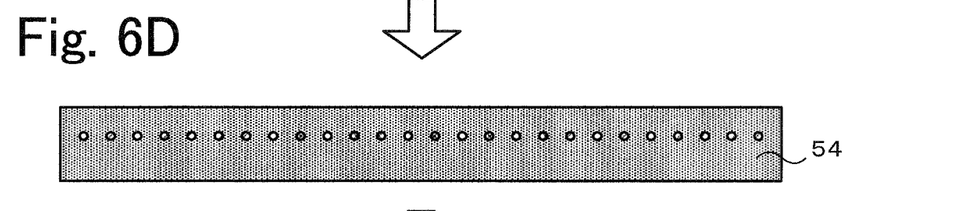

The dispersion medium contained in the ceramic molded body 53 is evaporated. A temperature and a time for the drying are set as appropriate depending on the type of the dispersion medium used. The drying temperature is, for example, 100 to 200° C. An atmosphere for the drying may be atmospheric air, an inert atmosphere, a vacuum, or a hydrogen atmosphere. In this step, the ceramic molded body 53 shrinks due to the drying by about 2 to 3% in the radial direction. In the dry shrinkage, a shrinkage length increases in a region closer to an outer periphery of the ceramic molded body 53. Even if the wire line 24 cannot follow the dry shrinkage of the ceramic molded body 53 during the drying of the ceramic molded body 53, the wire line 24 is movable in the first hole 251 because the wire line 24 is inserted into the first hole 251 of the connection terminal 25 with the play relative to the hole inner surface. Accordingly, great stress is not applied to the ceramic molded body 53.

(2) Degreasing

The binder, the dispersant, and the catalyst contained in the ceramic molded body 53 after evaporating the dispersion medium are decomposed. A decomposition temperature may be, for example, 400 to 600° C., and an atmosphere for the decomposition may be atmospheric air, an inert atmosphere, a vacuum, or a hydrogen atmosphere.

(3) Calcining

A calcined body 54 (see FIG. 6D) is obtained by performing heat treatment (calcination) at 750 to 1300° C. on the ceramic molded body 53 after the degreasing. The reason for performing the calcination is to increase the strength for easier handling. An atmosphere for the calcination may be atmospheric air, an inert atmosphere, a vacuum, or a hydrogen atmosphere. The degreasing and the calcination may be performed at a time after the drying. Although the ceramic molded body 53 shrinks during the degreasing and the calcination as well, a shrinkage rate during the drying is maximum.

5. Firing Step (See FIG. 6E)

Figure 6E:
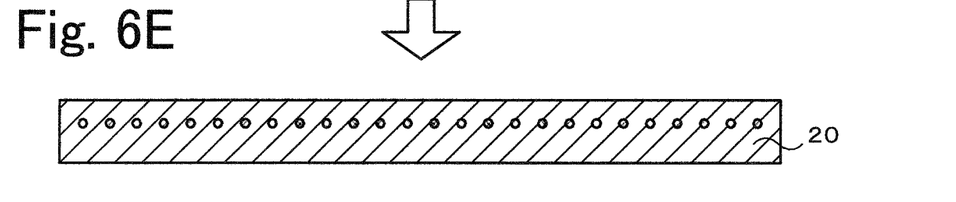

The ceramic plate 20 is obtained by performing hot-press firing on the calcined body 54. Although firing conditions are set as appropriate depending on the type of the powder, the particle size of the powder, and so on, it is preferable that a firing temperature is set to a range of 1000 to 2000° C. and a press pressure is set to a range of 50 to 400 kgf/cm$^2$. An atmosphere for the firing may be atmospheric air, an inert atmosphere, or a vacuum. During the hot-press firing, because the pressure is vertically applied to the calcined body 54 in the mold, the calcined body 54 shrinks in the vertical direction, but it hardly shrinks in the horizontal direction. After the hot-press firing, the ball-like connection terminal 25 has a shape vertically crushed from above and below.

6. Drilling Step and Shaft Bonding Step

Terminal holes are formed in the rear surface of the ceramic plate 20, and the terminals 21, 21, 23 and 23 are attached in the terminal holes. Furthermore, the gas holes 27 and the lift pin holes 28 are formed through the ceramic plate 20. Then, the power feeder rods 41, 41, 43 and 43 are attached to the terminals 21, 21, 23 and 23. Thereafter, the tubular shaft 40 is joined, by diffusion bonding, to the rear surface 20b of the ceramic plate 20 coaxially with the ceramic plate 20. Thus the ceramic heater 10 is obtained.

Figure 7:
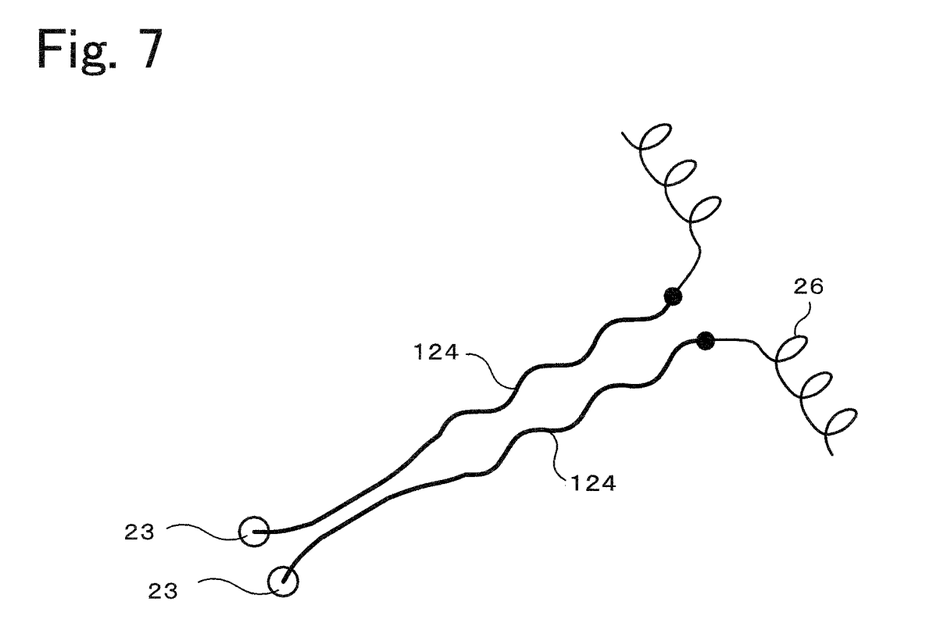
FIG. 7 is a partial sectional view when a terminal 23 and the outer-peripheral-side resistance heating element 26 are connected by a wavy wire line 124.

A comparative example of the ceramic heater was fabricated by modifying the above-described ceramic molded body 53 such that the wire line 24 and the outer-peripheral-side resistance heating element 26 were directly connected to each other without using the connection terminal 25, and an experiment was conducted to examine the occurrence of a crack during the drying step of the ceramic molded body. As a result, it was found that the crack occurred near a connecting portion between the wire line 24 and the outer-peripheral-side resistance heating element 26. In addition, another comparative example of the ceramic heater was fabricated by, as illustrated in FIG. 7, connecting the terminal 23 and the end portion of the outer-peripheral-side resistance heating element 26 by a wire line 124 having a wavy shape, and an experiment was conducted to examine the occurrence of a crack during the drying step of the ceramic molded body. This experiment was performed in expectation of that the wavy wire line 124 might stretch and shrink following the dry shrinkage of the ceramic molded body 53. Contrary to the expectation, however, the result showed that the crack occurred near the connecting portion between the wire line 24 and the outer-peripheral-side resistance heating element 26.

In the above-described ceramic heater 10 according to this embodiment, even if the wire line 24 cannot follow the dry shrinkage of the ceramic molded body 53 when the ceramic plate 20 is manufactured by the mold casting process, great stress is not applied to the ceramic molded body 53 because the wire line 24 is slidably inserted into the first hole 251 of the connection terminal 25. As a result, breakage of the ceramic plate 20 is suppressed.

Furthermore, since the wire line 24 is movable in the first hole 251 and the end portion 26a of the outer-peripheral-side resistance heating element 26 is also movable in the second hole 252 during the dry shrinkage of the ceramic molded body 53, the stress applied to the ceramic molded body can be further reduced.

Moreover, since the linear portion 24a of the wire line 24 penetrates through the first hole 251 of the connection terminal 25, the wire line 24 can be prevented from falling out of the first hole 251 of the connection terminal 25.

Since the connection terminal 25 used to manufacture the ceramic plate 20 has the ball-like shape and includes no edges in its outer surface, the occurrence of a crack starting from the outer surface of the connection terminal 25 can be suppressed.

In addition, the connection terminal 25 after the fabrication of the ceramic plate 20 has the shape vertically crushed from above and below the ceramic plate 20. Therefore, the inner surface of the crushed first hole 251 of the connection terminal 25 is reliably connected to the wire line 24, and the inner surface of the crushed second hole 252 of the connection terminal 25 is reliably connected to the end portion 26a of the outer-peripheral-side resistance heating element 26.

Since the outer-peripheral-side resistance heating element 26 is in the form of a coil except for the end portion 26a, an amount of heat generated from the outer-peripheral-side resistance heating element 26 can be relatively increased.

The present invention is not limited to the above-described embodiments, and can be carried out by various modes as long as they belong to the technical scope of the invention.

Figure 8:
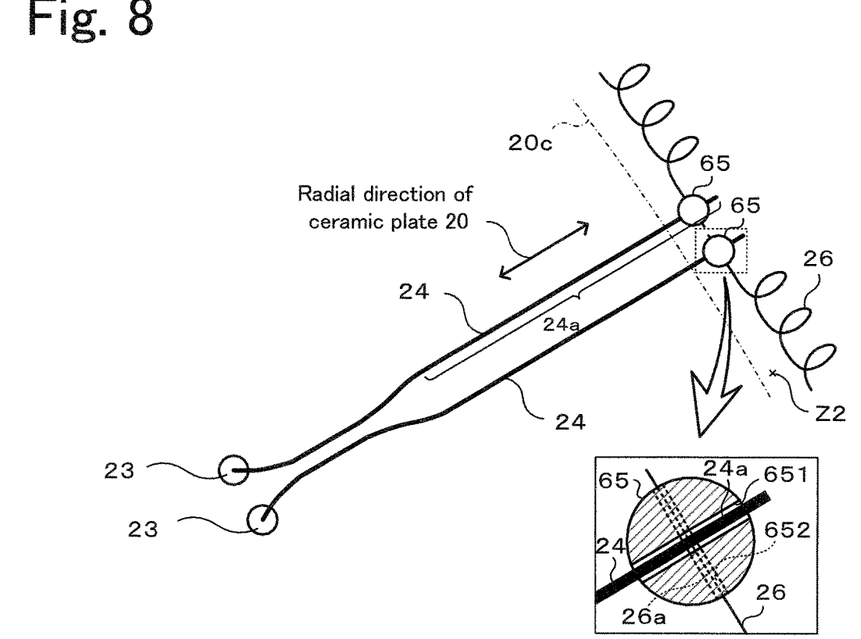
FIG. 8 is an explanatory view when looking at a region including a connection terminal 65 and its surroundings from above the ceramic plate.

For example, in the above-described embodiment, the first hole 251 and the second hole 252 of the connection terminal 25 are formed parallel to each other. However, like a connection terminal 65 illustrated in FIG. 8, a first hole 651 may be formed to extend along the radial direction of the ceramic plate 20, and a second hole 652 may be formed in a three-dimensionally crossing relation to the first hole 651. FIG. 8 is an explanatory view when looking at a region including the connection terminal 65 and its surroundings from above the ceramic plate. Even with such a structure, great stress is not applied to the ceramic molded body 53 because the linear portion 24a of the wire line 24 is movable in the first hole 651 in the radial direction of the ceramic plate 20 during the dry shrinkage of the ceramic molded body 53. In the case of FIG. 8, however, the end portion 26a of the outer-peripheral-side resistance heating element 26 is hardly movable in the radial direction of the ceramic plate 20 during the dry shrinkage of the ceramic molded body 53. Accordingly, it is preferable to, as in the above-described embodiment, form the first hole 251 and the second hole 252 parallel to each other such that the end portion 26a of the outer-peripheral-side resistance heating element 26 is also movable in the second hole 252 in the radial direction of the ceramic plate 20 during the dry shrinkage of the ceramic molded body 53.

Figure 9:
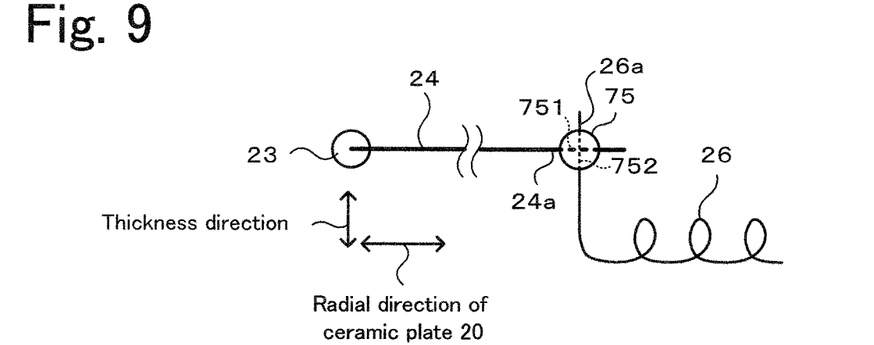
FIG. 9 is an explanatory view when looking at a region including a connection terminal 75 and its surroundings from the lateral side of the ceramic plate.
Figure 10:
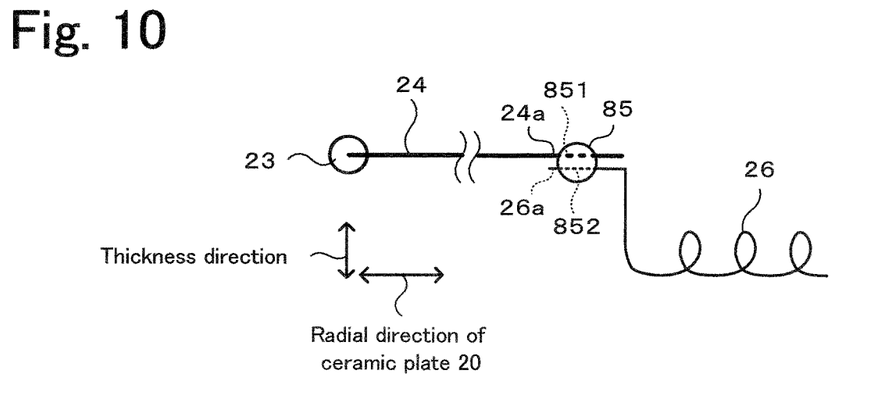
FIG. 10 is an explanatory view when looking at a region including a connection terminal 85 and its surroundings from the lateral side of the ceramic plate.

While, in the above-described embodiment, the wire line 24 and the outer-peripheral-side resistance heating element 26 are disposed in the same plane, the wire line 24 and the outer-peripheral-side resistance heating element 26 may be disposed in different planes as illustrated in FIGS. 9 and 10. FIGS. 9 and 10 are explanatory views when looking at regions including connection terminals 75 and 85 and their surroundings, respectively, from the lateral side of the ceramic plate. The connection terminal 75 in FIG. 9 is disposed in the same plane as the wire line 24. In the connection terminal 75, a first hole 751 is formed to extend along the radial direction of the ceramic plate 20, and a second hole 752 is formed to extend along the thickness direction in a three-dimensionally crossing relation to the first hole 751. The linear portion 24a of the wire line 24 is inserted into the first hole 751, and the linear portion 26a of the outer-peripheral-side resistance heating element 26, extending in the thickness direction, is inserted into the second hole 752. The connection terminal 85 in FIG. 10 is disposed in the same plane as the wire line 24. In the connection terminal 85, a first hole 851 is formed to extend along the radial direction of the ceramic plate 20, and a second hole 852 is formed parallel to the first hole 851. The linear portion 24a of the wire line 24 is inserted into the first hole 851, and the linear portion 26a of the outer-peripheral-side resistance heating element 26 is inserted into the second hole 852. The linear portion 26a in FIG. 10 is a portion that is obtained by extending a coil end of the outer-peripheral-side resistance heating element 26 in the thickness direction, and then by bending it substantially at a right angle to extend along the radial direction. In any of the cases of FIGS. 9 and 10, the wire line 24 can be placed with no need of paying attention to a pattern of the outer-peripheral-side heating element 26. Additionally, during the dry shrinkage of the ceramic molded body 53, only the linear portion 24a of the wire line 24 is movable in the direction of the shrinkage in FIG. 9, whereas the linear portion 26a of the outer-peripheral-side heating element 26 is also movable in the direction of the shrinkage in addition to the linear portion 24a of the wire line 24 in FIG. 10. For that reason, the case of FIG. 10 is more preferable.

Figure 11A:
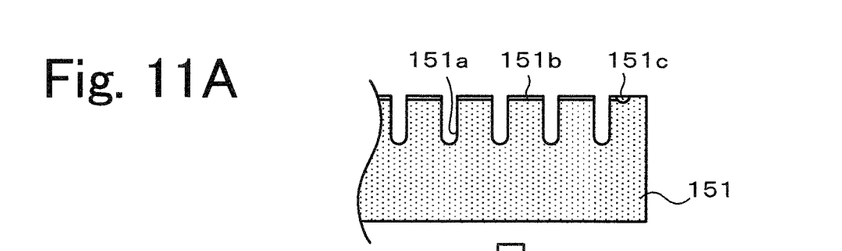
FIGS. 11A to 11C illustrate a manufacturing process for a ceramic heater in which the wire line 24 and the outer-peripheral-side resistance heating element 26 are disposed in different planes.
Figure 11B:
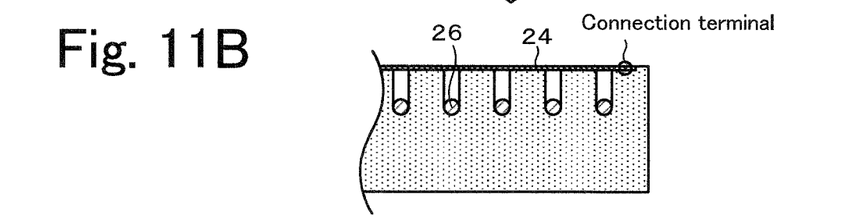
Figure 11C:
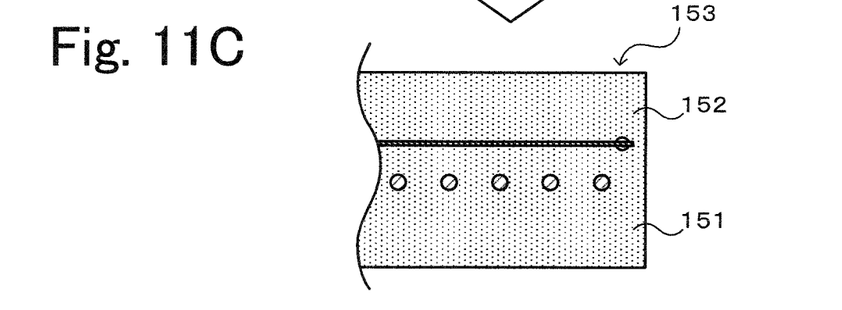

FIGS. 11A to 11C illustrate an example of a manufacturing process for a ceramic heater in which the wire line 24 and the outer-peripheral-side resistance heating element 26 are disposed in different planes. For a start, a first ceramic molded body 151 is formed by the mold casting process (see FIG. 11A). The first ceramic molded body 151 includes deep grooves 151a in which the inner- and outer-peripheral-side resistance heating elements 22 and 26 are to be placed, a shallow groove 151b in which the wire line 24 is to be placed, and a semicircular groove 151c in which the ball-like connection terminal is to be placed, the semicircular groove 151c being positioned at an outer peripheral end of the shallow groove 151b. Then, the inner-peripheral-side resistance heating element 22 (omitted in FIGS. 11A to 11C) and the outer-peripheral-side resistance heating element 26 are placed in the deep grooves 151a, the wire line 24 is placed in the shallow groove 151b, and the connection terminal is placed in the semicircular groove 151c (see FIG. 11B). At that time, the linear portion of the wire line 24 is inserted into the first hole of the connection terminal with a play relative to the hole inner surface, and the linear portion of the outer-peripheral-side resistance heating element 26 is inserted into the second hole. Then, a disk-shaped second ceramic molded body 152 is formed on an upper surface of the first ceramic molded body 151 by the mold casting process, and a ceramic molded body 153 including both the ceramic molded bodies 151 and 152 is dried to obtain a dried body (see FIG. 11C). Thereafter, the ceramic heater is obtained by performing hot-press firing on the dried body.

While, in the above-described embodiment, the inner-peripheral-side resistance heating element 22 and the outer-peripheral-side resistance heating element 26 are disposed in the same plane, the inner-peripheral-side resistance heating element 22 and the outer-peripheral-side resistance heating element 26 may be disposed in planes that are parallel to the wafer placement surface 20a and are positioned at different heights. As another example, an annular plain zone (namely, a zone where no resistance heating elements are wired) may be formed between the inner peripheral zone Z1 and the outer peripheral zone Z2. In such a case, another resistance heating element may be separately wired in a region on a plane parallel to the wafer placement surface 20a and different from the plane in which the heating elements 22 and 26 are disposed, the region being located corresponding to the annular plain zone.

While, in the above-described embodiment, the outer peripheral zone Z2 is explained as one zone, it may be divided into two or more small zones. In such a case, resistance heating elements in the form of coils are wired independently per zone. Furthermore, an end portion of each resistance heating element is connected, as illustrated in FIGS. 4 and 5, to the terminal in the central portion of the ceramic plate through the wire line and the connection terminal. The small zones may be formed in an annular shape by dividing the outer peripheral zone Z2 at one or more boundary lines that are concentric to the ceramic plate 20, or may be formed in a fan shape (namely, a shape resulting from developing a side of a truncated zone) by dividing the outer peripheral zone Z2 at one or more segments that extend radially from the center of the ceramic plate 20.

In the above-described embodiment, an electrostatic electrode may be embedded in the ceramic plate 20. In such a case, the wafer W can be electrostatically attracted to the wafer placement surface 20a by applying a voltage to the electrostatic electrode after the wafer W has been placed on the wafer placement surface 20a. Alternatively, an RF electrode may be embedded in the ceramic plate 20. In such a case, a not-illustrated shower head is disposed above the wafer placement surface 20a with a space kept therebetween, and radio frequency power is supplied to between parallel plate electrodes constituted by the shower head and the RF electrode. With that arrangement, CVD film formation or etching can be performed on the wafer W by generating plasma and utilizing the generated plasma. The above-mentioned electrostatic electrode may be further used as the RF electrode.

While, in the above-described embodiment, the connection terminal 25 used in fabricating the ceramic plate 20 has the ball-like shape, the connection terminal is not limited to such a specific example. As another example, the connection terminal may have an ellipsoidal shape, or a rectangular parallelepiped shape or a cubic shape each having chamfered round edges.

The present application claims priority from Japanese Patent Application No. 2019-027685 filed Feb. 19, 2019, the entire contents of which are incorporated herein by reference.

What is claimed is:

1. A ceramic heater comprising:
 a disk-shaped ceramic plate having a wafer placement surface and an annular outer peripheral zone;
 an outer-peripheral-side resistance heating element disposed in the outer peripheral zone;
 a wire line extending from each of a pair of terminals disposed in a central portion of the ceramic plate toward the outer peripheral zone, a portion of the wire line close to the outer peripheral zone being a linear portion; and
 a conductive connection terminal including a first hole into which the linear portion of the wire line is inserted, and a second hole into which an end portion of the outer-peripheral-side resistance heating element is inserted, the connection terminal electrically connecting between the wire line and the outer-peripheral-side resistance heating element,
 wherein the first hole linearly extends along a radial direction of the disk-shaped ceramic plate, and
 wherein the linear portion of the wire line penetrates through the first hole and is moveable in the first hole during dry shrinkage of the disk-shaped ceramic plate.

2. The ceramic heater according to claim 1, wherein the first hole and the second hole are parallel to each other.

3. The ceramic heater according to claim 2, wherein the outer-peripheral-side resistance heating element and the wire line are disposed in the same plane.

4. The ceramic heater according to claim 3, wherein the end portion of the outer-peripheral-side resistance heating element is moveable in the second hole during dry shrinkage of the disk-shaped ceramic plate.

5. The ceramic heater according to claim 1, wherein the outer-peripheral-side resistance heating element and the wire line are disposed in different planes, and
 the connection terminal is present in the plane in which the wire line is disposed.

6. The ceramic heater according to claim 5, wherein the second hole linearly extends along the radial direction of the disk-shaped ceramic plate.

7. The ceramic heater according to claim 5, wherein the first hole and the second hole are parallel to each other.

8. The ceramic heater according to claim 5, wherein the first hole and the second hole are oriented perpendicular to each other.

9. The ceramic heater according to claim 1, wherein the connection terminal has a shape including no edges on an outer surface thereof.

10. The ceramic heater according to claim 1, wherein the connection terminal has a shape vertically crushed from above and below the ceramic plate.

11. The ceramic heater according to claim 1, wherein the outer-peripheral-side resistance heating element is in the form of a coil.

12. The ceramic heater according to claim 1, wherein the conductive connection terminal is of a shape selected from the group consisting of ball-like, ellipsoidal, rectangular parallelepiped and cubic, and with each shape including no edges on an outer surface thereof.

13. A manufacturing method for a ceramic heater, comprising steps of:
 (a) forming a disk-shaped first ceramic molded body by a mold casting process;
 (b) placing an outer-peripheral-side resistance heating element in an outer peripheral zone located in a predetermined surface of the first ceramic molded body, placing a wire line extending from each of a pair of terminals disposed in a central portion of the first ceramic molded body toward the outer peripheral zone, a portion of the wire line close to the outer peripheral zone being a linear portion, inserting the linear portion of the wire line into a first hole of a conductive connection terminal with a play relative to a hole inner surface, the conductive connection terminal including the first hole and a second hole, and inserting an end portion of the outer-peripheral-side resistance heating element into the second hole, (c) forming a disk-shaped second ceramic molded body on the predetermined surface of the first ceramic molded body by the mold casting process;

(d) drying a ceramic molded body including the first and second ceramic molded bodies to obtain a dried body; and (e) performing hot-press firing on the dried body to electrically connect the wire line and the outer-peripheral side resistance heating element, wherein the first hole linearly extends along a radial direction of the first ceramic molded body, and wherein the linear portion of the wire line penetrates through the first hole and is moveable in the first hole during dry shrinkage of the ceramic molded body.

14. The manufacturing method according to claim 13, wherein the conductive connection terminal is of a shape selected from the group consisting of ball-like, ellipsoidal, rectangular parallelepiped and cubic and with each shape including no edges on an outer surface thereof.

* * * * *